(12) United States Patent
Lee

(10) Patent No.: US 10,194,549 B2
(45) Date of Patent: Jan. 29, 2019

(54) ACCESSORY APPARATUS, SYSTEM, AND METHOD FOR SUPPORTING HIERARCHICAL CONNECTION

(71) Applicant: Samsung Electronics Co. Ltd., Suwon-si, Gyeonggi-do (KR)

(72) Inventor: Seunghwan Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 806 days.

(21) Appl. No.: 13/961,317

(22) Filed: Aug. 7, 2013

(65) Prior Publication Data

US 2014/0055928 A1 Feb. 27, 2014

(30) Foreign Application Priority Data

Aug. 27, 2012 (KR) .................. 10-2012-0093953

(51) Int. Cl.
*G06F 13/00* (2006.01)
*H05K 7/00* (2006.01)
*G06F 1/16* (2006.01)

(52) U.S. Cl.
CPC ............. *H05K 7/00* (2013.01); *G06F 1/1632* (2013.01)

(58) Field of Classification Search
None
See application file for complete search history.

(56) References Cited

U.S. PATENT DOCUMENTS

| | | | |
|---|---|---|---|
| 2004/0177183 A1 | 9/2004 | Takahashi et al. | |
| 2007/0136025 A1* | 6/2007 | Lo .................. | G01R 31/31715 702/122 |
| 2007/0211559 A1 | 9/2007 | Choi et al. | |
| 2011/0098087 A1* | 4/2011 | Tseng .................. | G01C 21/265 455/557 |
| 2011/0099298 A1* | 4/2011 | Chadbourne ....... | G06F 11/3051 710/10 |
| 2011/0099300 A1* | 4/2011 | Siulinski ............ | H04N 5/23203 710/19 |
| 2011/0102073 A1* | 5/2011 | Riho .................. | H03K 19/0005 327/541 |
| 2011/0167187 A1 | 7/2011 | Crumlin et al. | |

(Continued)

FOREIGN PATENT DOCUMENTS

| | | |
|---|---|---|
| CN | 1534448 A | 10/2004 |
| CN | 101424958 A | 5/2009 |
| CN | 102056072 A | 5/2011 |

OTHER PUBLICATIONS

Chinese office action dated Nov. 13, 2018; Application # 201310368698.8.

*Primary Examiner* — Henry Tsai
*Assistant Examiner* — Aurangzeb Hassan
(74) *Attorney, Agent, or Firm* — Jefferson IP Law, LLP

(57) ABSTRACT

A system and a method for supporting a hierarchical connection of an accessory apparatus to a terminal and other accessory apparatuses are provided. The accessory apparatus includes a terminal connection interface connecting to a terminal, at least one connection interface connecting at least one other accessory apparatus, and an apparatus controller setting and controlling the terminal to identify a resistance value corresponding to a particular accessory apparatus according to whether the at least one other accessory apparatus is connected.

21 Claims, 11 Drawing Sheets

(56) References Cited

U.S. PATENT DOCUMENTS

| | | | |
|---|---|---|---|
| 2011/0320405 A1* | 12/2011 | Hsu | G06F 1/1632 |
| | | | 707/634 |
| 2012/0062275 A1* | 3/2012 | Hiraki | H03K 19/017545 |
| | | | 326/30 |
| 2012/0170204 A1* | 7/2012 | Ahn | G06F 1/1616 |
| | | | 361/679.41 |
| 2013/0111223 A1* | 5/2013 | Chang | H03M 1/186 |
| | | | 713/300 |
| 2013/0128678 A1* | 5/2013 | Pyeon | G11C 5/04 |
| | | | 365/194 |
| 2013/0307675 A1* | 11/2013 | Teng | G08C 17/02 |
| | | | 340/12.3 |
| 2013/0322010 A1* | 12/2013 | Hung | G06F 13/4081 |
| | | | 361/679.41 |

* cited by examiner

FIG. 3A
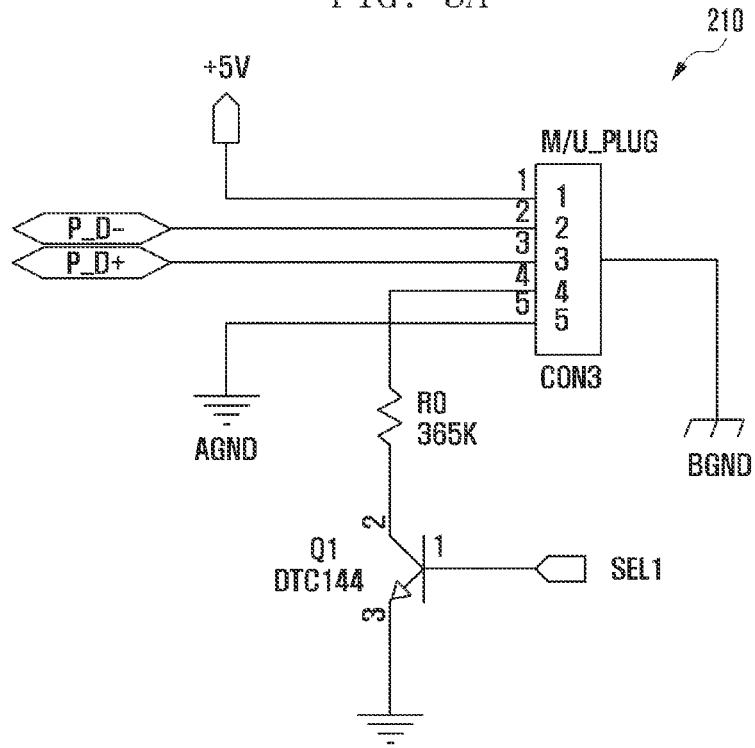
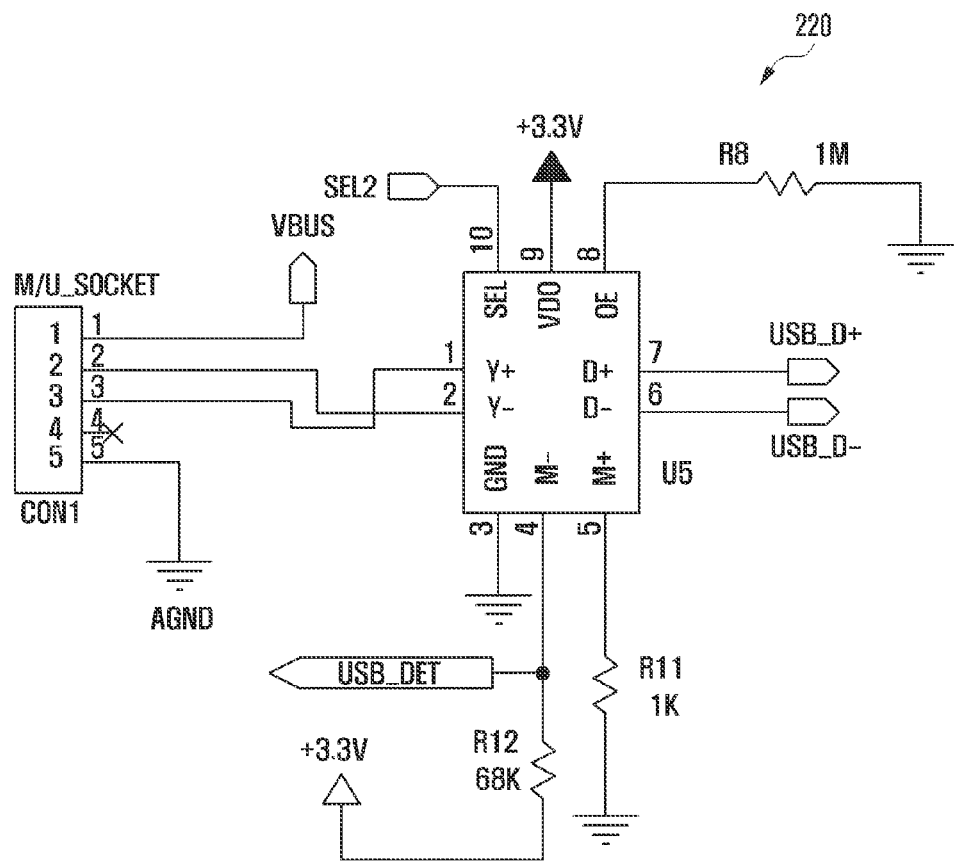

FIG. 3B
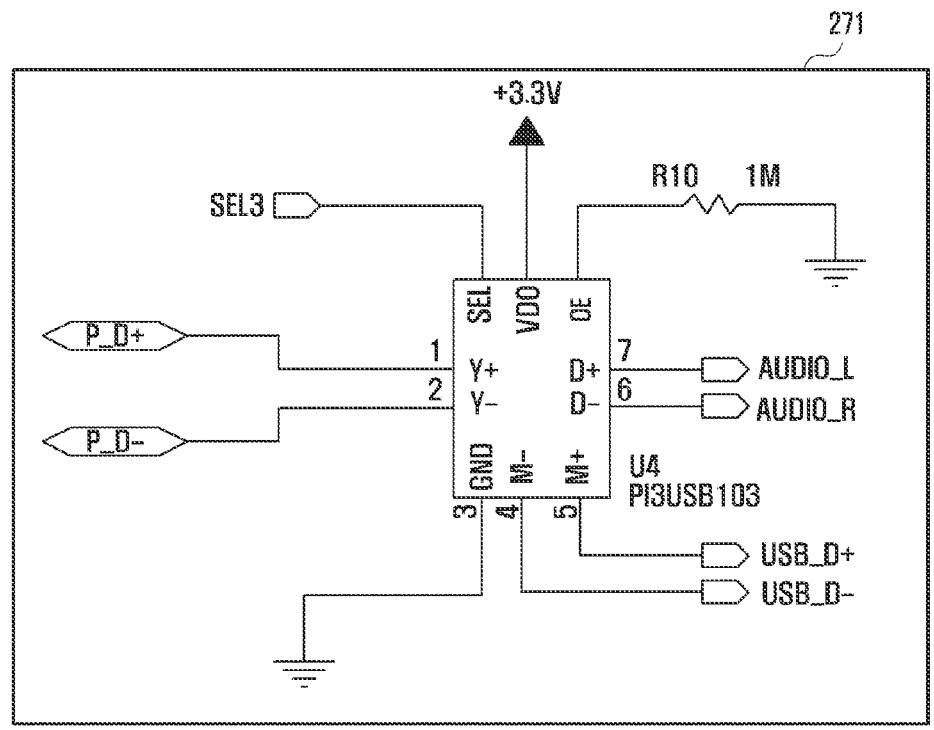
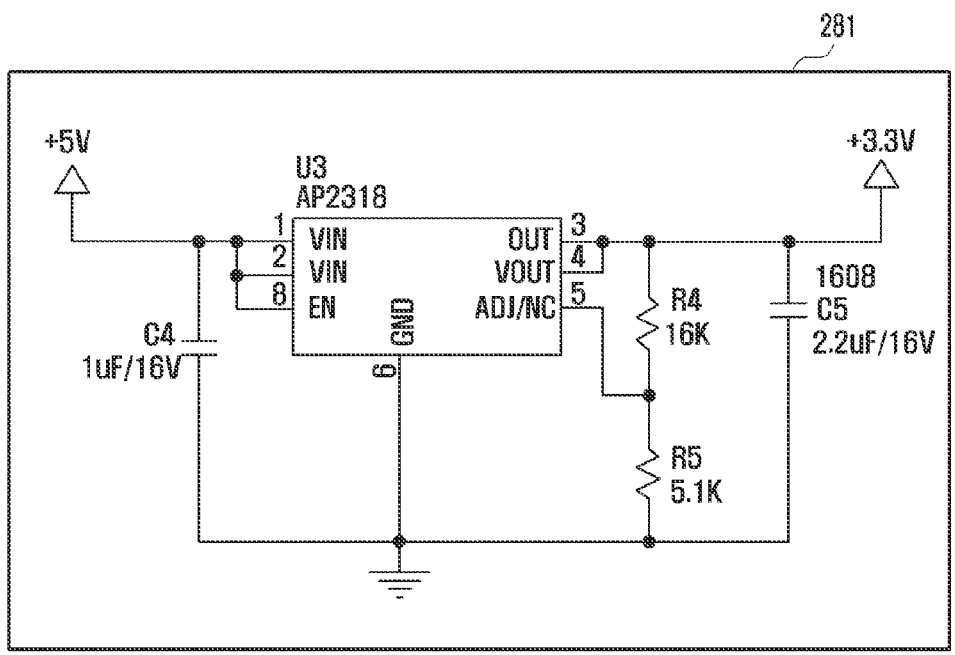

FIG. 3C
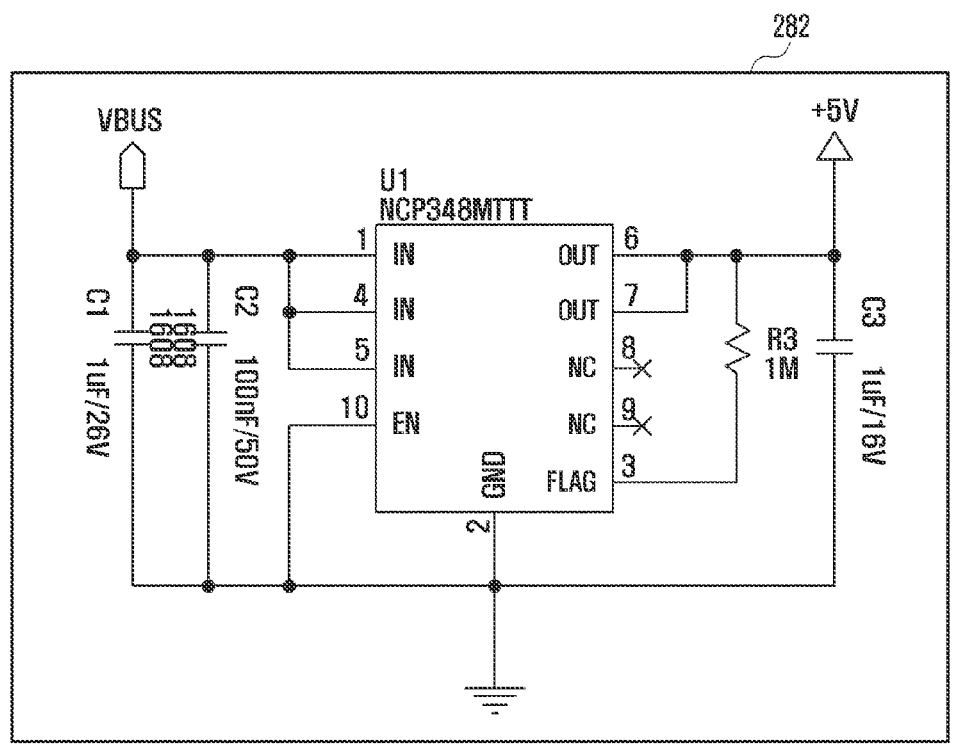
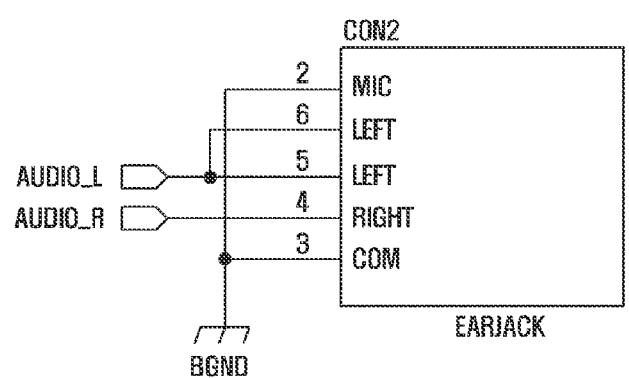

FIG. 4
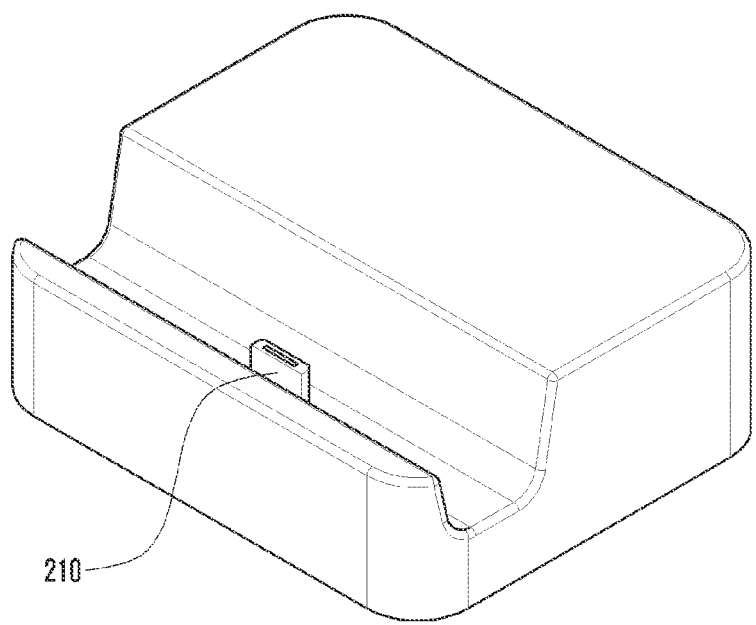
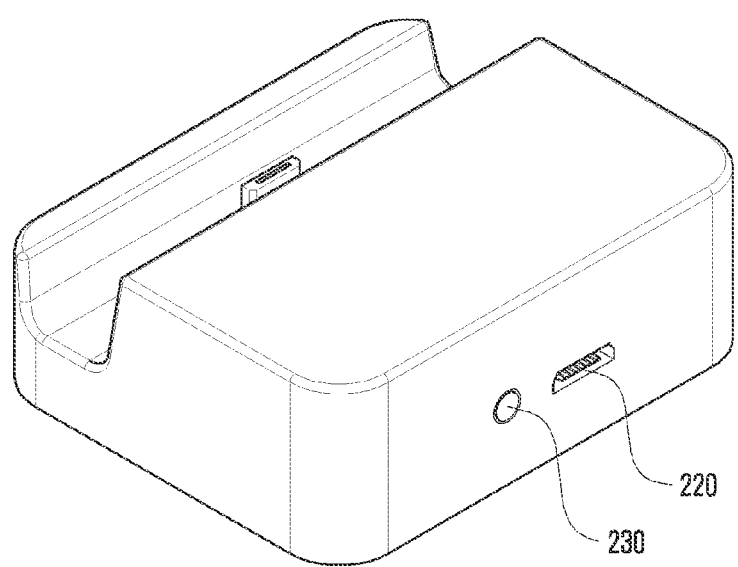

ACCESSORY APPARATUS, SYSTEM, AND METHOD FOR SUPPORTING HIERARCHICAL CONNECTION

PRIORITY

This application claims the benefit under 35 U.S.C. § 119(a) of a Korean patent application filed on Aug. 27, 2012 in the Korean Intellectual Property Office and assigned Serial No. 10-2012-0093953, the entire disclosure of which is hereby incorporated by reference.

BACKGROUND OF THE INVENTION

1. Field of the Invention

The present invention relates generally to an accessory apparatus connected to a terminal. More particularly, the present invention to an accessory apparatus, system, and method for supporting a hierarchical connection in which various accessory apparatuses are hierarchically operated in a terminal.

2. Description of the Related Art

Portable terminals are used in various business fields as well as industrial and commercial fields due to communication functions based on mobility thereof. The portable terminal has been developed beyond merely providing a communication function so as to provide various functions that are supported according to users' demands. Further, as functions of portable terminals are expanded such that a multitasking function is supported, the users may use various functions provided by the portable terminal.

Meanwhile, the portable terminal may have a light and simple form and accordingly, may have limited space to which components are mounted. In order to overcome such a limited space, accessories may be developed and applied to support various functions. For example, a related-art portable terminal may operate accessory apparatuses, such as an earphone system and an external speaker system, to support an audio output function. Further, the related-art terminal may support a connection function with another apparatus to update functions and install a particular program.

The related-art portable terminal may provide a particular interface for an external accessory access. The user connects various external accessories to the related-art portable terminal through the particular interface and then uses the connected external accessories and the related-art portable terminal. However, since the related-art portable terminal may limit the type of the external accessories which may directly access the particular interface to only one according to spatial limitation and physical characteristics of supportable hardware, accessing of additional external accessories may be restricted. That is, a user may perform only a particular function through the terminal even though the user possesses various external accessories. Accordingly, when the user desires to use various functions, the user should alternately mount the various external accessories to the related-art portable terminal to use the various functions, which may cause user inconvenience. Particularly, when the terminal is put on a dock having a particular function, for example, a charger dock, the related-art portable terminal may perform only a charging function provided by the corresponding dock, and other functions may not be used.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide an accessory apparatus, system, and method for supporting a hierarchical connection in which accessory apparatuses are hierarchically connected to a terminal and then operated.

In accordance with an aspect of the present invention, an accessory apparatus supporting a hierarchical connection is provided. The accessory apparatus includes a terminal connection interface connecting to a terminal, at least one connection interface connecting at least one other accessory apparatus, and an apparatus controller setting and controlling the terminal to identify a resistance value corresponding to a particular accessory apparatus according to whether the at least one other accessory apparatus is connected.

In accordance with another aspect of the present invention, an accessory system supporting a hierarchical connection is provided. The accessory system includes a terminal having an external apparatus connection interface in a Micro-Universal Serial Bus (USB) type, a first accessory apparatus connected to the external apparatus connection interface of the terminal, and at least one second accessory apparatus connected to the first accessory apparatus, wherein the first accessory apparatus includes a terminal connection interface connecting to the terminal, at least one connection interface connecting at least one other accessory apparatuses, and an apparatus controller setting and controlling the terminal to identify a resistance value corresponding to a particular accessory apparatus according to whether the at least one other accessory apparatus is connected.

In accordance with another aspect of the present invention, a method of operating an accessory supporting a hierarchical connection to a terminal is provided. The method includes connecting a first accessory apparatus with at least one of an external apparatus connection interface of the terminal and at least one second accessory apparatus, connecting the first accessory apparatus with the terminal, and setting and controlling the terminal to identify a resistance value corresponding to a particular accessory apparatus according to connections of the at least one second accessory apparatus or the first accessory apparatus.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIGS. 3A to 3D are circuit diagrams of components of a first accessory apparatus of FIG. 2 according to an exemplary embodiment of the present invention;

FIG. 4 illustrates an exterior of a first accessory apparatus of FIG. 1 according to an exemplary embodiment of the present invention;

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, exemplary embodiments of the present invention will be described in detail with reference to the accompanying drawings.

In descriptions of exemplary embodiments of the present invention, descriptions of contents of technologies which are not known and directly related to the present invention will be omitted. Further, detailed descriptions of components having substantially the same configuration and function will be omitted.

For the same reason, some components are exaggerated, omitted, or schematically illustrated in the accompanying drawings, and a size of each component does not totally reflect an actual size. Therefore, the present invention is not limited by a relative size or interval included in the accompanying drawings.

Figure 1:
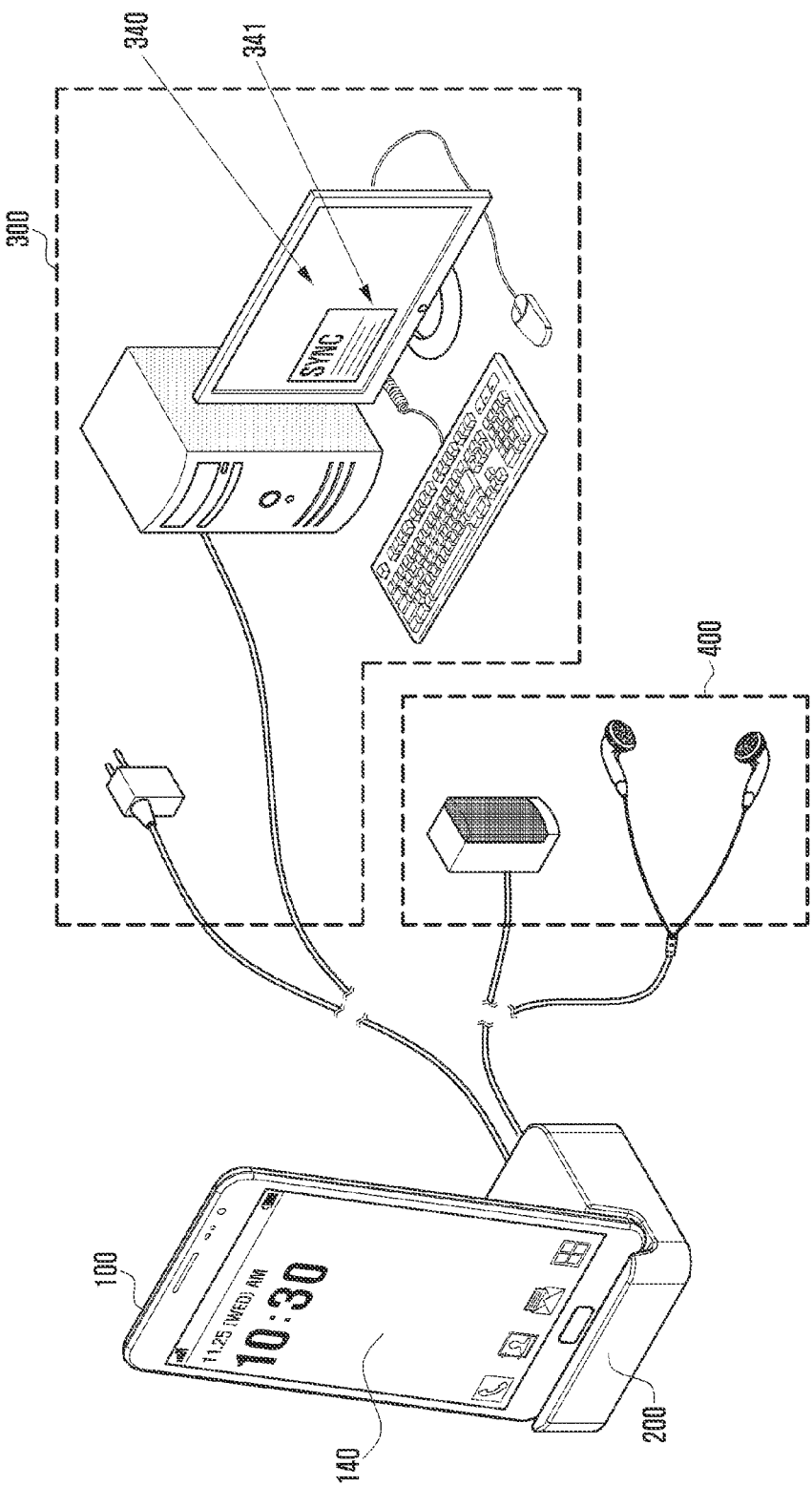
FIG. 1 illustrates a configuration of an accessory system which supports a hierarchical connection according to an exemplary embodiment of the present invention.

FIG. 1 illustrates a configuration of an accessory system which supports a hierarchical connection according to an exemplary embodiment of the present invention.

Referring to FIG. 1, an accessory system 10, which supports a hierarchical connection, includes a terminal 100, a first accessory apparatus 200 and one or more second accessory apparatuses 300 and 400. The terminal 100 may include a display unit 140 and the second accessory apparatuses 300 and 400 may include an apparatus display unit 340 displaying an information area 341.

The accessory system 10 allows, when the first accessory apparatus 200 is inserted into the terminal 100 and when the one or more second accessory apparatuses 300 and 400 are connected with the first accessory apparatus 200, terminal 100 to recognize the connections of the second accessory apparatuses 300 and 400 to support a function of the first accessory apparatus 200 and/or functions of the second accessory apparatuses 300 and 400. Particularly, by transmitting information needed for operations of the second accessory apparatuses 300 and 400 connected with the first accessory apparatus 200, the second accessory apparatuses 300 and 400 are directly connected with the terminal 100 and then operated. Alternatively, the accessory system 10 transmits information corresponding to a particular accessory apparatus, which synthetically provides the functions of the first accessory apparatus 200 and the second accessory apparatuses 300 and 400, to the terminal 100 to synthetically support the functions of the first accessory apparatus 200 and the second accessory apparatuses 300 and 400. Further, even though a plurality of second accessory apparatuses 300 and 400 are connected to the first accessory apparatus 200, the first accessory apparatus 200 supports normal operations of the second accessory apparatuses 300 and 400. During such a process, the accessory system 10 may support operations of various functions of the plurality of second accessory apparatuses 300 and 400 by using one external apparatus connection interface formed in the terminal 100, for example, one Micro-Universal Serial Bus (USB) interface.

As described above, the terminal 100 may provide one external apparatus connection interface for the connection of the external accessory apparatus. The external apparatus connection interface may be the Micro-USB interface or any other similar and/or suitable type of interface that may be included in the terminal 100. The Micro-USB interface includes a plurality of signal and data lines, including a VBUS signal line for a power connection, a D+ data line and a D− data line for data transmission/reception, a GND signal line for the grounding, and a USB Identifier (ID) port for determining an accessed external accessory. The terminal 100 determines a type of external accessory apparatus connected to the external apparatus connection interface and supports a user function according to the type of external accessory apparatus.

The terminal 100 receives USB-ID information, for example, a particular resistance value from the external accessory apparatus connected to the external apparatus connection interface, and determines a type of the external accessory apparatus according to the corresponding resistance value by using a predefined table. Further, the terminal 100 supports performance of a function according to the determined type of external accessory apparatus. Particularly, the terminal 100 connects a multifunction supporting dock corresponding to the first accessory apparatus 200 with the external apparatus connection interface, and performs processing for supporting a function of the particular accessory apparatus according to a USB ID value provided by the connected multifunction supporting dock. The configuration of the terminal 100 will be described in more detail with reference to the drawings later.

The first accessory apparatus 200 includes a terminal connection interface in a connector type inserted into the external apparatus connection interface of the terminal 100, for example, the Micro-USB interface, and may be an apparatus which supports a particular function. Particularly, the first accessory apparatus 200 may be a multifunction supporting dock which hierarchically supports connections of the one or more second accessory apparatuses 300 and 400. The first accessory apparatus 200 includes one or more connection interfaces and transmits information on the types of second accessory apparatuses 300 and 400 connected with the connection interface to the terminal 100. Further, when the terminal 100 transmits data for performing functions of the second accessory apparatuses 300 and 400, the first accessory apparatus 200 transmits the data to the second accessory apparatuses 300 and 400 and transmits signals from the second accessory apparatuses 300 and 400 to the terminal 100. Meanwhile, the first accessory apparatus 200 includes a configuration of an apparatus for supporting a particular function therein and outputs data transmitted by the terminal 100. A detailed configuration of the first accessory apparatus 200 will be described in more detail with reference to the drawings described later.

The second accessory apparatuses 300 and 400 may be connected with the terminal 100 through the first accessory apparatus 200 and may be apparatuses which may be directly connected with the terminal 100 of which the connection with the first accessory apparatus 200 is removed according to a user's control.

The second accessory apparatuses 300 and 400 include a connector which may be connected with the terminal 100 or the first accessory apparatus 200 and may be various accessory apparatuses such as an adaptor apparatus for supporting charging of the terminal 100 through the first accessory apparatus 200, a computing apparatus for performing communication with the terminal 100 through the first accessory apparatus 200, and an audio apparatus for receiving data transmitted by the terminal 100 through the first accessory apparatus 200 and outputting the received data, as illustrated in FIG. 1. Further, although not illustrated in FIG. 1, the second accessory apparatuses 300 and 400 may be further various apparatuses which can be connected to the first accessory apparatus 200, for example, a TV output apparatus, a print apparatus, a home theater apparatus, an electronic frame apparatus, an electronic screen apparatus, a dongle apparatus including at least one communication module, a button external input apparatus for a character input, a keyboard, a handwriting external input apparatus for drawing or memo writing, and any other similar and/or suitable apparatus that may be connected to the terminal 100. As described above, the second accessory apparatuses 300 and 400 are not limited to particular apparatuses, have a connector which can be connected with the connection interface formed in the first accessory apparatus 200, and may be at least one of various accessory electronic apparatuses which is compatible and connectable with the terminal 100 to perform a particular function.

Figure 2:
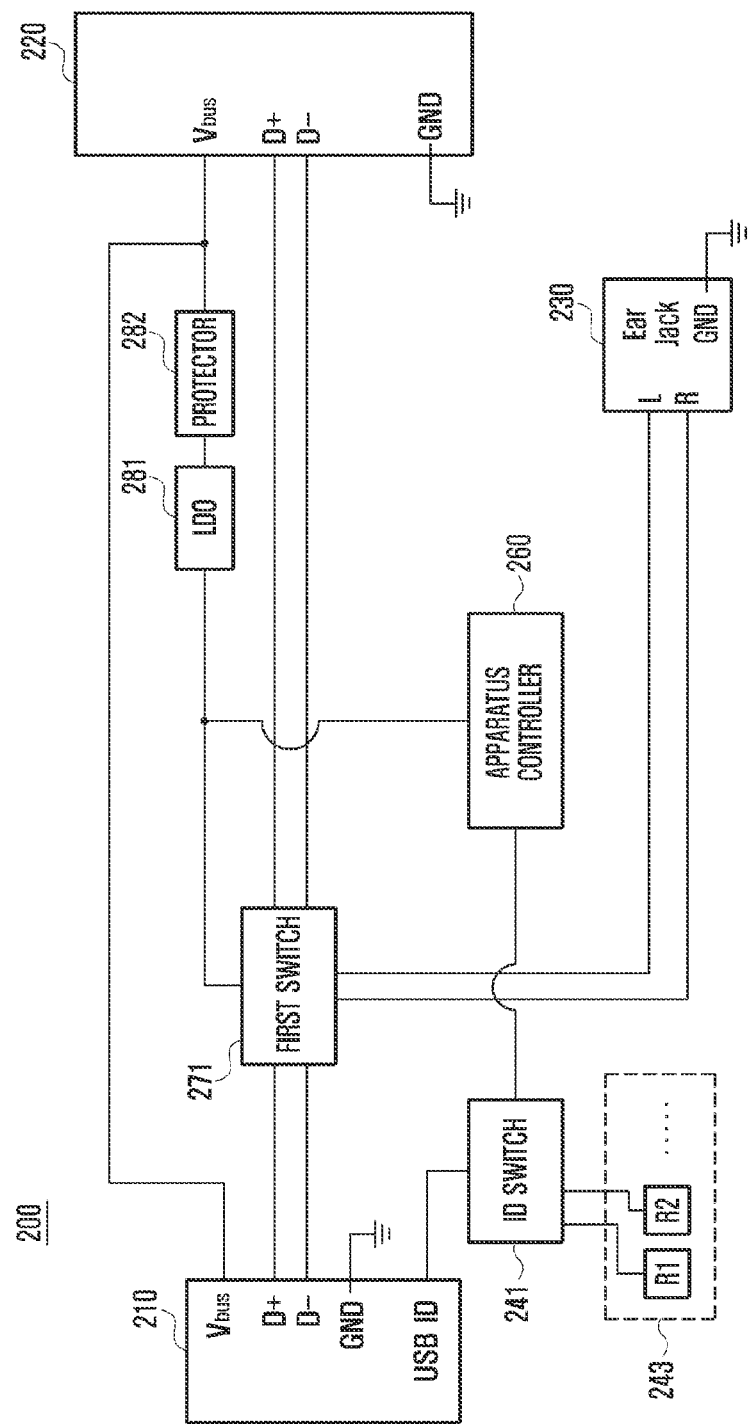
FIG. 2 illustrates a configuration of a first accessory apparatus of FIG. 1 in more detail according to an exemplary embodiment of the present invention.
Figure 3D:
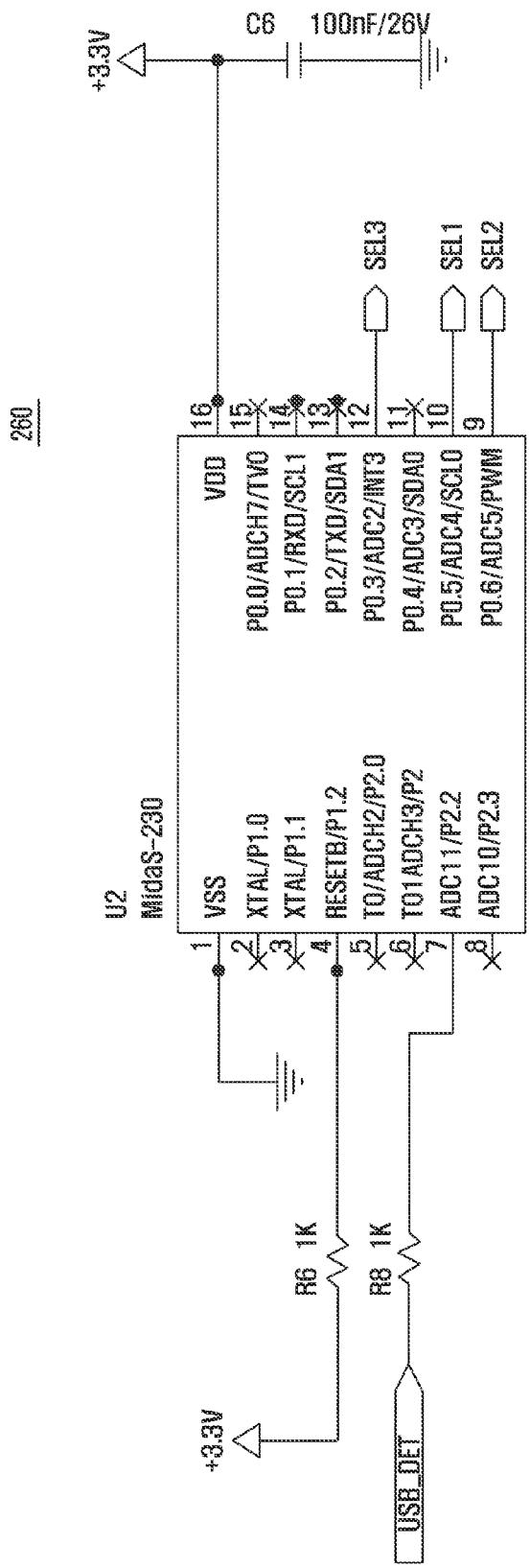

FIG. 2 illustrates a configuration of a first accessory apparatus of FIG. 1 in more detail according to an exemplary embodiment of the present invention, and FIGS. 3A to 3D are circuit diagrams of components of a first accessory apparatus of FIG. 2 according to an exemplary embodiment of the present invention. Further, FIG. 4 illustrates an exterior of a first accessory apparatus according to an exemplary embodiment of the present invention.

Referring to FIGS. 2 to 4, the first accessory apparatus 200, according to the present exemplary embodiment, includes a terminal connection interface 210, a first connection interface 220, a second connection interface 230, a first switch 271, a Low-Dropout Regulator (LDO) 281, a protector 282, an apparatus controller 260, an ID switch 241, and one or more resistances 243.

The first accessory apparatus 200 having the above described configuration according to the present exemplary embodiment is connected with the external apparatus connection interface formed in the terminal 100 by using the terminal connection interface 210 and transmits information on types of second accessory apparatuses 300 and 400, which are connected with at least one of the first connection interface 220 and the second connection interface 230, to the terminal 100. Accordingly, the first accessory apparatus 200 provides support such that the terminal 100 normally performs the functions of the second accessory apparatuses 300 and 400. In such a process, the first accessory apparatus 200 identifies types of connected second accessory apparatuses 300 and 400 and supports transmission of information corresponding to the types of second accessory apparatuses 300 and 400 to the terminal 100. Alternatively, the first accessory apparatus 200 supports transmission of information corresponding to a particular accessory apparatus which provides the function supported by the first accessory apparatus 200 and the functions supported by the second accessory apparatuses 300 and 400. Accordingly, the terminal 100 supports performance of the functions of the hierarchically connected second accessory apparatuses 300 and 400, in spite of the connection of the first accessory apparatus 200, or supports performance of the functions of the first accessory apparatus 200 and the second accessory apparatuses 300 and 400.

The first accessory apparatus 200 identifies the second accessory apparatuses 300 and 400 connected with the first connection interface 220 and controls a selective switching of the first switch 271 according to the types of second accessory apparatuses 300 and 400. In a more detailed description, when the first accessory apparatus 200 is connected with the external apparatus connection interface of the terminal 100, the terminal 100 determines that a multifunction supporting dock is inserted into the first accessory apparatus 200. The first accessory apparatus 200 may determine a particular resistance value as USB ID information which identifies the type of accessory apparatus in the terminal connection interface 210. Here, the particular resistance value may be a resistance value corresponding to the multifunction supporting dock.

Accordingly, when the terminal connection interface 210 is inserted into the external apparatus connection interface of the terminal 100, the terminal 100 may identify the connection of the multifunction supporting dock through an identification of a resistance value transmitted through the USB ID port. Then, the terminal 100 supports performance of the function according to predefined scheduling information. For example, when the multifunction supporting dock supports a charging function of the terminal 100 by default, the terminal 100 may charge a battery by using a charging current provided from the first accessory apparatus 200 corresponding to the multifunction supporting dock. The terminal 100 may also output predefined particular information, for example, time information on the display unit 340, as illustrated in FIG. 1. Further, when the first accessory apparatus 200 corresponding to the multifunction supporting dock is connected to the terminal 100, then the terminal 100 may transmit an audio signal to the first accessory apparatus 200.

Meanwhile, when the second accessory apparatuses 300 and 400 are connected with the first connection interface 220, the first accessory apparatus 200 identifies states of data lines D+ and D− of the first connection interface 220. That is, the apparatus controller 260 of the first accessory apparatus 200 identifies a short state or an open state of the data lines D+ and D− of the first connection interface 220. For the identification of the state, the apparatus controller 260 identifies connection states of the second accessory apparatuses 300 and 400 connected with the first connection interface 220 by transmitting a predetermined signal to the data lines D+ and D− of the first connection interface 220 and identifying a feedback signal state of the corresponding signal.

When the connection states of the second accessory apparatuses 300 and 400 correspond to short states, then the apparatus controller 260 may determine that the connected second accessory apparatuses 300 and 400 is a travel adaptor. Further, when data connection states of the second accessory apparatuses 300 and 400 correspond to open states, then the apparatus controller 260 determines that the connected second accessory apparatuses 300 and 400 may be computing apparatuses. First, when the second accessory apparatuses 300 and 400 are determined to be a charger, then the controller 260 controls the ID switch 241 to control a resistance connected to the USB ID port of the terminal connection interface 210 to be a resistance corresponding to an audio output desk dock, for example, R1.

Then, the terminal 100 determines that the first accessory apparatus 200 connected with the external apparatus connection interface is an apparatus corresponding to the audio output desk dock and performs a corresponding function. For example, the terminal 100 charges a battery by using a charging current provided through the VBUS port or supports an operation of the terminal 100, and supports an output of an audio signal to the first accessory apparatus 200 through the data ports D+ and D− of the terminal connection interface 210.

The apparatus controller 260 of the first accessory apparatus 200 controls the first switch 271 to support connections between the data lines D+ and D− of the terminal connection interface 210 and the second connection interface 230. Accordingly, when the audio signal is transmitted from the terminal 100, the corresponding audio signal is transmitted to the second connection interface 230 via the data lines D+ and D− of the terminal connection interface 210 and the first switch 271. When an external audio system corresponding to the second accessory apparatus is connected with the second connection interface 230, then the corresponding audio signal is output through the external audio system. The second connection interface 230 may be a jack connection interface.

As a result, the terminal 100 identifies the first accessory apparatus 200 connected with the external apparatus connection interface as the audio output desk dock and supports performance of a predefined charging function and audio output function. Accordingly, the terminal 100 presets the performance of the audio signal output function and charging function when the connection of the first accessory apparatus 200 corresponding to the audio output desk dock is identified.

Meanwhile, when data connection states of the second accessory apparatuses 300 and 400 connected with the first connection interface 220 correspond to the open states, then the apparatus controller 260 of the first accessory apparatus 200 controls the ID switch 241 to control a corresponding resistance, for example, R2 to be connected with the USB ID port. R2 is a resistance value corresponding to the second accessory apparatuses 300 and 400 having the open state of the data connection state, for example, a resistance value for performing a setting such that the terminal 100 identifies the first accessory apparatus 200 as a data synchronization desk dock.

When it is determined that the R2 is connected with the USB ID port, then the terminal 100 determines that the first accessory apparatus connected with the external apparatus connection interface is the data synchronization desk dock. In this case, the terminal 100 transmits a signal for data synchronization to the terminal connection interface 210 of the first accessory apparatus 200. The signal for the data synchronization is transmitted to the first connection interface 220 through the data lines D+ and D− of the terminal connection interface 210. As a result, the signal for the data synchronization is transmitted to the second accessory apparatuses 300 and 400 connected with the first connection interface 220.

The apparatus controller 260 of the first accessory apparatus 200 controls the first switch 271 to transmit the signal for the data synchronization to the second accessory apparatuses 300 and 400 through the terminal connection interface 210 and the first connection interface 220. That is, the data synchronization signal output from the terminal 100 is transmitted to the second accessory apparatuses 300 and 400 connected with the first connection interface 220 via the data lines D+ and D− of the terminal connection interface 210, the first switch 271, and the data lines D+ and D− of the first connection interface 220. Accordingly, as illustrated in FIG. 1, the information area 341, according to the data synchronization, may be output to one side of an apparatus display unit 340 of the second accessory apparatuses 300 and 400. Information indicating the data synchronization through the connection of the terminal 100 may be output to the corresponding information area 341.

When the second accessory apparatuses 300 and 400 for performing the data synchronization with the terminal 100 supply power, corresponding power is transmitted to the VBUS port of the terminal connection interface 210 through the VBUS port of the first connection interface 220. Further, the corresponding power may be supplied to the terminal 100 connected with the terminal connection interface 210.

As described above, the first accessory apparatus 200 according to the present exemplary embodiment has one or more resistances 243 corresponding to the one or more second accessory apparatuses 300 and 400. The first accessory apparatus 200 identifies types of connected second accessory apparatuses 300 and 400 and then supports a connection between a particular resistance and the external apparatus connection interface of the terminal 100. Accordingly, the present exemplary embodiment supports performance of the functions of the second accessory apparatuses 300 and 400 hierarchically connected with the external apparatus connection interface of the terminal 100 without any change in an algorithm of the terminal 100. The user can use the functions supported by the second accessory apparatuses 300 and 400 even if the user separates the terminal 100 from the multifunction supporting dock in a state where the terminal 100 is inserted into the multifunction supporting dock and then hierarchically connects the second accessory apparatuses 300 and 400 with the first accessory apparatus 200 instead of directly connecting the second accessory apparatuses 300 and 400 with the terminal 100. Further, when the first accessory apparatus 200 supports the charging function of the terminal 100, complex functions are supported together with the functions of the one or more connected second accessory apparatuses 300 and 400. Accordingly, the first accessory apparatus 200 sets a resistance value connected to the USB ID port as a value corresponding to an accessory apparatus in a particular form which supports all the functions of the first accessory apparatus and the second accessory apparatuses.

A configuration of the LDO 281 of the first accessory apparatus 200, described with reference to FIG. 2, drops and outputs power needed for driving the apparatus controller 260 and the first switch 271. The LDO 281 is connected with the VBUS port of the first connection interface 220 through the protector 282. As a result, the LDO 281 may support driving of the apparatus controller 260 and the first switch 271 by controlling power provided by the second accessory apparatuses 300 and 400 connected with the first connection interface 220. The protector 282 protects the first accessory apparatus 200 from at least one of an over current and an over voltage for power from the second accessory apparatuses 300 and 400 connected with the first connection interface 220.

Meanwhile, although it has been described that the apparatus controller 260 and the first switch 271 are driven using the power supplied from the second accessory apparatuses 300 and 400 connected with the first connection interface 220, the present invention is not limited thereto. That is, the first accessory apparatus 200, according to the present invention, may be designed to receive power from the terminal 100 connected with the terminal connection interface 210 and drive the apparatus controller 260, the first switch 271, and the ID switch 241 by using the power provided by the terminal 100 according to a designer's intention. In this case, the signal lines connected with the VBUS port of the first connection interface 220 may be omitted, but signal lines for connecting the VBUS port of the terminal connection interface 210, the apparatus controller 260, the first switch 271, and the ID switch 241 may be included. When the first accessory apparatus 200 is driven with power supplied from the terminal 100, configurations of the LDO 281 and the protector 282 may be omitted, and power output through the VBUS port of the terminal 100 may be controlled in accordance with the driving of the apparatus controller 260, the first switch 271, and the ID switch 241 and then the controlled power is provided.

Alternatively, the terminal 100 provides power for driving the apparatus controller 260, and the apparatus controller 260 distributes the corresponding driving power so as to be converted to power for driving the first switch 271 and the ID switch 241 and supplies and controls the corresponding power. Accordingly, the first accessory apparatus 200 further includes a power supply line for connecting the VBUS port of the terminal connection interface 210 and the apparatus controller 260, a power supply line located among the apparatus controller 260, the first switch 271, and the ID switch 241, and a control signal line for a control.

Figure 5:
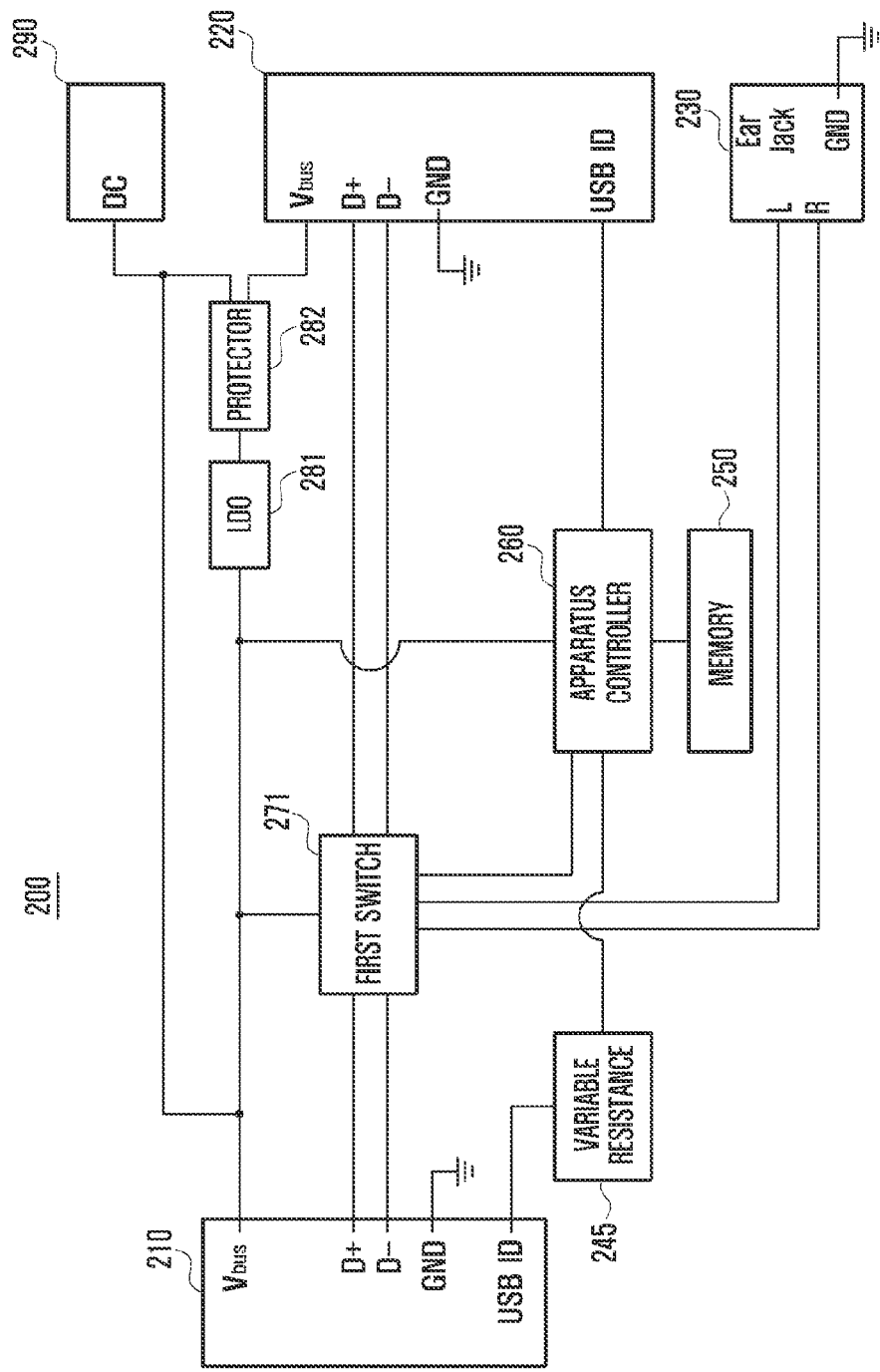
FIG. 5 illustrates a configuration of a first accessory apparatus according to an exemplary embodiment of the present invention.

FIG. 5 illustrates a configuration of a first accessory apparatus according to an exemplary embodiment of the present invention.

Referring to FIG. 5, a first accessory apparatus 200, according to the present exemplary embodiment, includes the terminal connection interface 210, the first connection interface 220, the second connection interface 230, a variable resistance 245, the apparatus controller 260, a memory 250, the first switch 271, the LDO 281, the protector 282, and a power connection interface 290.

An external apparatus ID table is stored in the memory 250 and provides a support such that the apparatus controller 260 identifies the second accessory apparatuses 300 and 400 connected with the first connection interface 220 by using a resistance value connected with the USB ID port. The external apparatus ID table includes information corresponding to each resistance value allocated for each type of accessory apparatuses and may include information on predefined resistance values. Accordingly, when the second accessory apparatuses 300 and 400 are connected with the first connection interface 220, the apparatus controller 260 identifies the resistance value connected with the USB ID and identifies which apparatus is connected with reference to the external apparatus ID table.

When the second accessory apparatuses 300 and 400 are connected, the apparatus controller 260 controls a particular resistance value to be transmitted to the terminal 100 through the terminal connection interface 210 by controlling a resistance value of the variable resistance 245. The apparatus controller 260 controls the variable resistance 245 to have a resistance value which substantially matches a resistance value for distinguishing the second accessory apparatuses 300 and 400 in one-to-one correspondence. Alternatively, the apparatus controller 260 may control the variable resistance 245 to have a particular resistance value in order to simultaneously support the multifunction according to a type of second accessory apparatuses 300 and 400.

For example, when the second accessory apparatuses 300 and 400 corresponding to the data synchronization apparatus are connected with the first connection interface 220, the apparatus controller 260 controls the variable resistance 245 to have a resistance value corresponding to a data synchronization desk dock which simultaneously performs a data synchronization function and a charging function. Then, the terminal 100 determines that the first accessory apparatus 200 corresponding to the data synchronization data dock is connected with the terminal connection interface 210 and performs the charging together with the data synchronization. The first accessory apparatus 200 may be in a state where power is supplied through the power connection interface 290 or power is supplied from the second accessory apparatuses 300 and 400 connected with the first connection interface 220. The apparatus controller 260 supports connections between the data lines D+ and D− of the terminal connection interface 210 and the data lines D+ and D− of the first connection interface 220 by controlling the first switch 271 to support the above described functions.

Meanwhile, a charger may be connected with the first connection interface 220. Then, the apparatus controller 260 identifies a resistance value of the second accessory apparatuses 300 and 400 connected with the first connection interface 220 and controls the variable resistance 245 in accordance with the identified resistance value. At this time, the controller 260 identifies the external apparatus ID table to identify a type of second accessory apparatuses 300 and 400 connected with the first connection interface 220 and controls a resistance value of the variable resistance 245 with reference to the type of second accessory apparatuses 300 and 400. That is, the controller 260 may control the resistance value of the variable resistance 245 to be a value corresponding to the audio output desk dock. Then, the terminal 100 determines the first accessory apparatus 200 connected with the terminal connection interface 210 as an apparatus corresponding to the audio output desk dock and performs the charging together with the audio output. The apparatus controller 260 controls the data lines D+ and D− of the terminal connection interface 210 to be connected with the second connection interface 230 by controlling the first switch 271.

As described above, the first accessory apparatus 200 according to the present exemplary embodiment may identify the external apparatus ID table pre-stored in the memory 250 to distinguish the second accessory apparatuses 300 and 400 and resistance values of the second accessory apparatuses 300 and 400 connected with the first connection interface 220. Further, the first accessory apparatus 200, according to the present exemplary embodiment may control the resistance value of the variable resistance 245 according to a connection state of the power connection interface 290 and types of second accessory apparatuses 300 and 400 connected with the first connection interface 220. Then, the terminal 100 identifies the accessory apparatus as an apparatus to be identified by the first accessory apparatus 200 and performs a corresponding operation. According to the present exemplary embodiment, the accessory system for supporting the hierarchical connection through such functions changes functions of the terminal 100 according to types of one or more second accessory apparatuses 300 and 400 connected with the first accessory apparatus 200. That is, when only one second accessory apparatus 300 or 400 is connected, the first accessory apparatus 200 supports performance of a function corresponding to the second accessory apparatus 300 or 400. When a plurality of second accessory apparatuses 300 and 400 are connected, then the first accessory apparatus 200 provides a support such that the terminal 100 performs functions for operating the plurality of second accessory apparatuses 300 and 400.

According to another exemplary embodiment, when a button or an external input apparatus having a drawing function is connected with the first connection interface 220, then the apparatus controller 260 identifies the types of second accessory apparatuses 300 and 400 through identification of a resistance value of the external input apparatus connected to the first connection interface 220. Further, the apparatus controller 260 may control the variable resistance 245 to have a resistance value substantially corresponding to the second accessory apparatuses 300 and 400. Then, the terminal 100 determines that the external input apparatus is connected with the external apparatus connection interface and performs signal processing for operating the external input apparatus.

Accordingly, the first accessory apparatus 200 supports the functions corresponding to the second accessory apparatuses 300 and 400 even though the mounted terminal 100 is separated and then the second accessory apparatuses 300 and 400 are directly connected with the first accessory apparatus 200 instead of directly connecting the second accessory apparatuses 300 and 400 with the terminal 100. Such a function significantly reduces insertion and separation processes between the terminal 100 and accessory apparatuses during a process of selectively connecting various external apparatuses with the terminal 100.

Meanwhile, when the second accessory apparatuses 300 and 400 are connected with the first connection interface 220 of the first accessory apparatus 200 and power is supplied to the power connection interface 290, then the apparatus controller 260 controls the variable resistance 245 to have a resistance value substantially corresponding to an external accessory apparatus including all of a power supply function and functions of the second accessory apparatuses 300 and 400. Then, it is determined that an accessory apparatus which supports all of the power supply function and the functions of the second accessory apparatuses 300 and 400 is connected with the external apparatus connection interface, and the terminal 200 supports corresponding charging and signal processing. Accordingly, the first accessory apparatus 200 may synthetically support operations of the second accessory apparatuses 300 and 400 complexly connected with the connection interface.

According to another exemplary embodiment, when an earphone apparatus corresponding to the second accessory apparatuses 300 and 400 is connected with the second connection interface 230, the apparatus controller 260 of the first accessory apparatus 200 controls the variable resistance 245 to have a resistance value corresponding to the earphone apparatus. The apparatus controller 260 also controls the second connection interface 230 to include a connection path by controlling the first switch 271. That is, the apparatus controller 260 controls the first switch 271 to form a signal path including the data lines D+ and D− of the terminal connection interface 210, the first switch 271, and the data lines D+ and D− of the second connection interface 230.

The terminal 100 determines that the earphone apparatus corresponding to the external accessory apparatus is connected according to a setting of the resistance value of the variable resistance 245 and supports signal processing for supporting the earphone apparatus. As a result, the earphone apparatus corresponding to the second accessory apparatuses 300 and 400 is connected with the terminal 100 through the first accessory apparatus 200 and supports an output of an audio signal provided by the terminal 100. Accordingly, the present exemplary embodiments may support performance of the functions of the second accessory apparatuses 300 and 400 without separation of the terminal 100 from the first accessory apparatus 200 in a state where the terminal 100 is mounted to the first accessory apparatus 200. Alternatively, the present exemplary embodiments may support the functions of the second accessory apparatuses 300 and 400 even though the terminal 100 is connected with the first accessory apparatus 200 in a state where the first accessory apparatus 200 and the second accessory apparatuses 300 and 400 are connected with each other.

Meanwhile, when the earphone apparatus corresponding to the second accessory apparatuses 300 and 400 is connected with the second connection interface 230 and a charging adaptor for a power supply is connected with the power connection interface, the first accessory apparatus 200 controls the variable resistance 245 to have a resistance value corresponding to a predefined audio output desk dock which may supply all the power supply function and the audio output function. Accordingly, although the earphone apparatus and the charging adaptor for the power supply are hierarchically connected with the first accessory apparatus 200 in practice, the terminal 200 determines that the audio output desk dock is connected with the external apparatus connection interface and simultaneously supports the power charging function and the audio output function.

Meanwhile, when one of the second accessory apparatuses 300 and 400 is removed from the first accessory apparatus 200, then the apparatus controller 260 provides a support such that the removal is identified as a connection of a new accessory apparatus through a corresponding control of the variable resistance 245. That is, when the earphone apparatus is removed from the second connection interface 230, then the apparatus controller 260 controls the variable resistance 245 to have a resistance value substantially corresponding to the charger to control the terminal 100 to support performance of only the function according to a connection of the charger. Alternatively, when the earphone apparatus is separated from the second connection interface 230, the apparatus controller 260 controls a predefined resistance value of the variable resistance 245 such that a charging desk dock is determined as being connected. Then, the terminal 100 determines that the charging desk dock is connected with the external apparatus connection interface, operates power input through the power connection interface 290, and supports a preset particular function. For example, the terminal 100 may control to output time information on a display unit as the preset particular function. Accordingly, the terminal 100 may support the charging function using supplied power while outputting the time information.

Meanwhile, although it has been described that the first connection interface 220, the second connection interface 230, and the power connection interface 290 are removable, the present invention is not limited thereto. That is, the first accessory apparatus 200 may be integrally provided as an apparatus for supporting an external speaker system instead of a form where the external speaker system is removable. That is, the first accessory apparatus 200 may be connected with the second connection interface 230 in a form where the external speaker system cannot be separated mechanically or physically. In such a case, the apparatus controller 260 may support the operation of the first accessory apparatus 200 in a state where the external speaker system is connected with the second connection interface 230 to support a basic function provided by default.

Accordingly, the apparatus controller 260 sets the variable resistance 245 to have a resistance value substantially corresponding to the external speaker system. Then, when the first accessory apparatus 200 is connected, the terminal 100 determines that the external speaker system is connected and supports only an audio signal output. The audio signal output by the terminal 100 may be transmitted to the external speaker system via the terminal connection interface 210, the first switch 271, and the second connection interface 230.

Further, when the charging adaptor for the power supply is connected with the power connection interface 290, the apparatus controller 260 controls the variable resistance 245 to have the resistance value corresponding to the audio output desk dock as described above. The terminal 100 determines a change in the variable resistance 245 as the connection of the audio output desk dock and performs the charging function together with the audio output.

Meanwhile, in a state where the external speaker system is connected with the second connection interface 230, a computing apparatus may be connected with the first connection interface 220 as the second accessory apparatuses 300 and 400. Then, the apparatus controller 260 controls the first switch 271 to connect the newly connected computing apparatus with the terminal connection interface 210 and controls the resistance value of the variable resistance 245 by controlling the first switch 271. That is, the first accessory apparatus 200 controls the variable resistance to have a resistance value corresponding to the data synchronization desk dock. Accordingly, the terminal 100 identifies the first access apparatus 200 connected with the external apparatus connection interface as the data synchronization desk dock for performing the data synchronization function and the power supply function and supports performance of the corresponding data synchronization function and charging function.

When the connection between the first connection interface 220 and the computing apparatus is released, then the first accessory apparatus 200 controls the variable resistance to allow the terminal 100 to determine that the release is a connection of the accessory apparatus having the external speaker system or the external speaker system and the charging function. That is, in a computing apparatus operation process, when an event for a connection release of the terminal 100 is generated, then at least one of the terminal 100 and the computing apparatus outputs an event corresponding to a data synchronization connection release and releases a previously formed data synchronization connection. The apparatus controller 260 receives a signal corresponding to the data synchronization connection release from at least one of the terminal 100 and the computing apparatus. Alternatively, when determining the data synchronization connection release occurs, the apparatus controller 260 controls the variable resistance 245 to support the operation of the external speaker system.

Even though corresponding accessory apparatuses are not separated from the connection interface mechanically in a process of controlling the accessory apparatuses, the first accessory apparatus 200 may support performance of automatic connection switching of the apparatuses by supplying the above described functions. Accordingly, at least one of the terminal 100 and the first accessory apparatus 200 perform processing for informing of a connection of the accessory apparatus having a new function. That is, the terminal 100 identifies a change in the accessory apparatus by detecting the resistance value of the variable resistance 245 of the terminal connection interface 210 according to a predetermined period or predetermined event generation. For example, when the data synchronization release event of the computing apparatus is generated, then the terminal 100 performs the detection of the resistance value of the variable resistance 245 and supports performance of the function corresponding to the resistance value. During such a process, the first accessory apparatus 200 identifies generation of the data synchronization release between the terminal 100 and the computing apparatus and controls the variable resistance 245 to have a resistance value corresponding to the external speaker system or the audio output desk dock. Then, the terminal 100 identifies the connection release of the computing connection and the connection of the external speaker system or the audio output desk dock, and performs the audio output function or the audio output function and the charging function.

Meanwhile, although it has been described that the terminal 100 identifies and supports the change in the function of the first accessory apparatus through the identification of the variable resistance 245 of the first accessory apparatus 200, the present invention is not limited thereto. That is, the apparatus controller 260 of the first accessory apparatus 200 transmits a predefined reset signal for identifying the accessory apparatus to the terminal 100. The reset signal may be transmitted to the terminal 100 when connections and releases of the second accessory apparatuses 300 and 400 are generated in at least one of the first connection interface 220, the power connection interface 290, and the second connection interface 230. When the corresponding reset signal is received, after a predetermined time passes, the terminal 100 identifies the resistance value of the variable resistance 245 and supports the function of the accessory apparatus corresponding to the resistance value. Alternatively, the first accessory apparatus 200 further includes a switch for switching the terminal connection interface 210 and controls the terminal connection interface 210 to turn-on or turn-off the connection of the terminal 200 through a control of the switch. The turning-on and off by the terminal connection interface 210 generates an effect when the first accessory apparatus 200 is removed from the external apparatus connection interface of the terminal 100 and then inserted into the external apparatus connection interface of the terminal 100 again. As describe above, the turning-on and off by the terminal connection interface 210 corresponds to a function replacing the reset signal, which is performed at a time when the reset signal is provided.

Meanwhile, according to another exemplary embodiment of connections of the second accessory apparatuses 300 and 400, an accessory apparatus which supports a data output function including at least one of audio and video functions, such as a TV output apparatus, a print apparatus, a home theater apparatus, an electronic frame apparatus, an electronic screen apparatus, and any other similar and/or suitable apparatus having audio and video functions may be connected. Then, the first accessory apparatus 200 sets the variable resistance 245 to have a resistance value corresponding to each accessory apparatus and provides support such that the first connection interface 220 and the terminal connection interface 210 form a signal path. Further, when power for charging is supplied to the power connection interface 290, the terminal 100 controls the variable resistance 245 to support performance of a charging power function together with the data output function.

In addition, a dongle apparatus including at least one communication module may be connected with the first connection interface 220 of the first accessory apparatus 200. Then, the first accessory apparatus 200 sets a resistance value substantially corresponding to the connected dongle apparatus and supports performance of a particular communication function supported by the dongle apparatus through recognition of the dongle apparatus.

As described above, the first accessory apparatus 200, according to the present exemplary embodiment, includes the interface connected with the terminal 100 and one or more interfaces connected with the one or more second accessory apparatuses 300 and 400 and includes the variable resistance 245 to allow the terminal 100 to distinguish types of external accessory apparatuses so as to provide a support such that various accessory apparatuses are more easily and conveniently connected with the terminal 100 and then operated.

Figure 6:
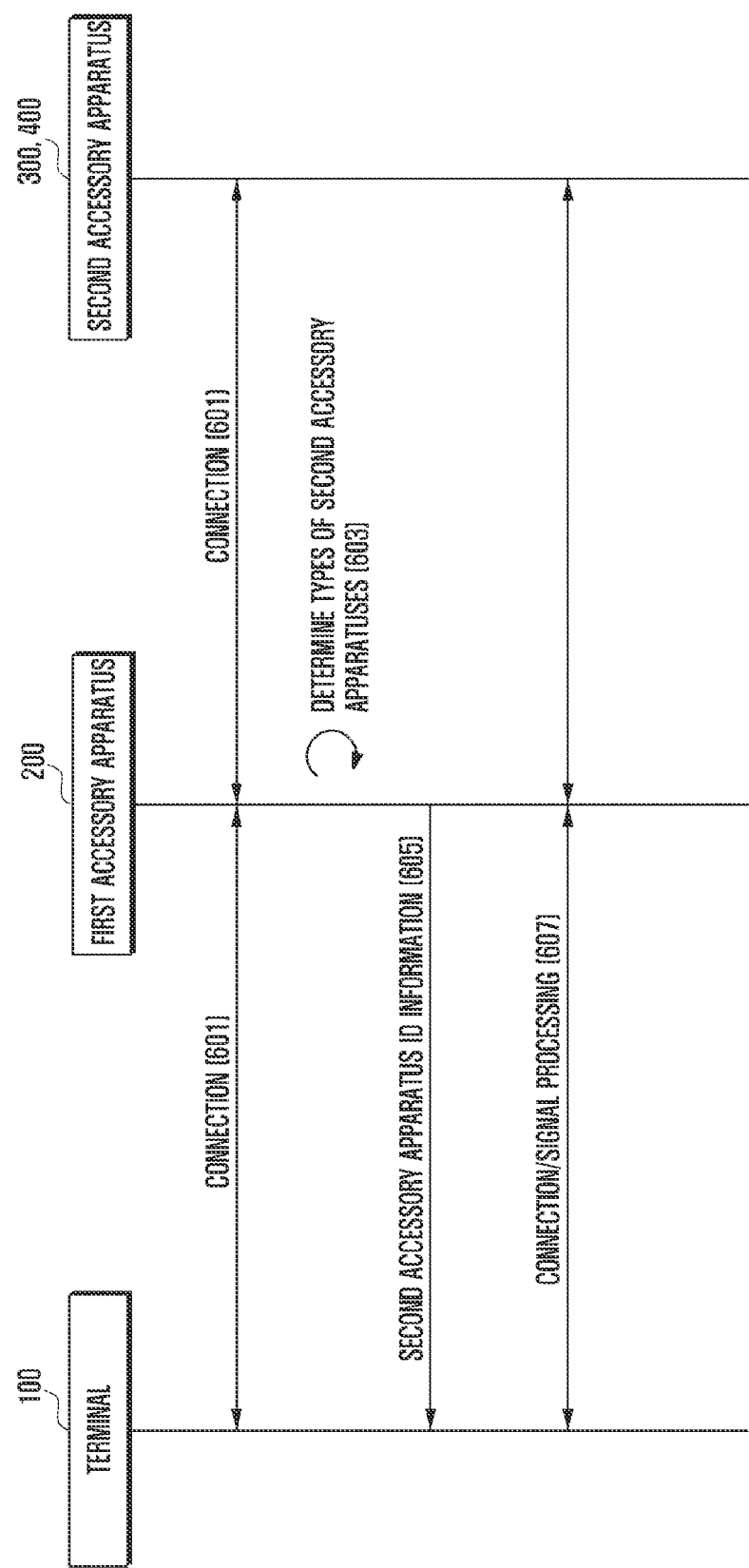
FIG. 6 is a diagram illustrating a signal flow between system components for describing a method of operating an accessory system which supports a hierarchical connection according to an exemplary embodiment of the present invention.

FIG. 6 is a diagram illustrating a signal flow between system components for describing a method of operating an accessory system which supports a hierarchical connection according to an exemplary embodiment of the present invention.

Referring to FIG. 6, the method of operating the system according to the present exemplary embodiment may perform connections among the terminal 100, the first accessory apparatus 200, and the second accessory apparatuses 300 and 400 in step 601. For the connections, the terminal connection interface 210 of the first accessory apparatus 200 may be inserted into the external apparatus connection interface of the terminal 100. The external apparatus connection interface may be a Micro-USB connection interface or any other similar and/or suitable type of connection, and the terminal connection interface 210 may be a connector which may be inserted into the Micro-USB connection interface. Accordingly, the terminal connection interface 210 may include a VBUS signal line, data lines D+ and D−, a USB ID signal line, and a GND signal line. Further, a connector included in the second accessory apparatuses 300 and 400 may be connected with at least one of the first connection interface 220 or the second connection interface 230 of the first accessory apparatus 200 and the power connection interface 290.

When the one or more second apparatuses 300 and 400 are connected, the first accessory apparatus 200 may determine types of one or more second accessory apparatuses 300 and 400 in step 603. The first accessory apparatus 200 identifies states of the data lines D+ and D− of the second accessory apparatuses 300 and 400 to identify the second accessory apparatuses 300 and 400 or identifies resistance values of the second accessory apparatuses 300 and 400 connected with the USB ID line. In the identification of the states of the data lines D+ and D−, when the data lines D+ and D− of the second accessory apparatuses 300 and 400 are in open states, then the first accessory apparatus 200 identifies the second accessory apparatuses 300 and 400 as communication function apparatuses. Alternatively, when the data lines D+ and D− of the second accessory apparatuses 300 and 400 are in short states, them the first accessory apparatus 200 identifies the second accessory apparatuses 300 and 400 as charging function apparatuses. Meanwhile, in the identification of the resistance value, the first accessory apparatus 200 determines the types of second accessory apparatuses 300 and 400 by comparing a pre-stored external apparatus ID table with the resistance values of the second accessory apparatuses 300 and 400.

Next, the first accessory apparatus 200 may set resistance values corresponding to the one or more second accessory apparatuses 300 and 400 connected to one or more connection interfaces. Accordingly, second accessory apparatus ID information corresponding to the resistance value set to the first accessory apparatus 200 may be transmitted to the terminal 100 in step 605. The second accessory apparatus ID information transmitted at this time is information corresponding to the one or more second accessory apparatuses 300 and 400 and varies depending on an amount and types of second accessory apparatuses 300 and 400 connected with the one or more connection interfaces. That is, the first accessory apparatus 200 includes the one or more resistances 243 of various sizes and the ID switch 241, or the variable resistance 245 to set resistances corresponding to the one or more second accessory apparatuses 300 and 400 connected with the one or more connection interfaces. Particularly, when one of the second accessory apparatuses 300 or 400 is connected to the terminal 100, the first accessory apparatus 200 selects one of the one or more resistances 243 or controls the resistance value of the variable resistance 245 to have a resistance value substantially corresponding to the second accessory apparatus 300 or 400. Further, when a plurality of second accessory apparatuses 300 and 400 are connected to the terminal 100, then the first accessory apparatus 200 may support the setting of the resistance such that a resistance value corresponding to a particular accessory apparatus which may support all the functions of the plurality of second accessory apparatuses is transmitted to the terminal 100.

Thereafter, the terminal 100 is connected with the second accessory apparatuses 300 and 400 connected with the first accessory apparatus 200 and supports signal processing for supporting functions in step 607. That is, the terminal 200 may support performance of the functions of the one or more second accessory apparatuses 300 and 400 connected with the first accessory apparatus 200. For example, the terminal 100 may provide at least one of a charging function, an audio output function, a video output function, a data synchronization function, a data communication function, an external input function, and any other similar and/or suitable function.

Meanwhile, the first accessory apparatus 200, which is connected with the second accessory apparatuses 300 and

400, is connected with the terminal 100, or the second accessory apparatuses 300 and 400 are connected with the first accessory apparatus 200 connected with the terminal 100 in step 601. The second accessory apparatuses 300 and 400 are first connected with the first accessory apparatus 200, then the first accessory apparatus 200 sets the resistance value of the variable resistance 245 or the resistance values of the one or more resistances 243 to have values substantially corresponding to the one or more second accessory apparatuses 300 and 400. When the first accessory apparatus 200 connected with the second accessory apparatuses 300 and 400 is connected to the terminal 100, then the terminal 100 identifies the external accessory apparatus by identifying the resistance value and supports performance of a corresponding function. The resistance value set by the first accessory apparatus 200 may be a resistance value substantially corresponding to the accessory apparatus in a particular form which synthetically supports the function of the first accessory apparatus 200 and one or more functions of the second accessory apparatuses 300 and 400.

Meanwhile, when the one or more second accessory apparatuses 300 and 400 are connected with the first accessory apparatus 200 in a state where the first accessory apparatus 200 is connected with the terminal 100, then the first accessory apparatus 200 sets the variable resistance 245 or the resistance value of the resistances 243 to have a resistance value corresponding to the particular external accessory apparatus to support the function of the first access apparatus 200 and one or more functions of the second accessory apparatuses 300 and 400. When resistance value is changed, then the terminal 100 determines that there is a new accessory apparatus connection and performs signal processing for supporting functions of the accessory apparatuses according to the newly set resistance value. Alternatively, based on a reset signal of the first accessory apparatus 200 or signal processing corresponding to the reset signal, the terminal 100 again performs identification of the first accessory apparatus 200 and performs signal processing for supporting functions of the accessory apparatuses according to the newly set resistance value.

Figure 7:
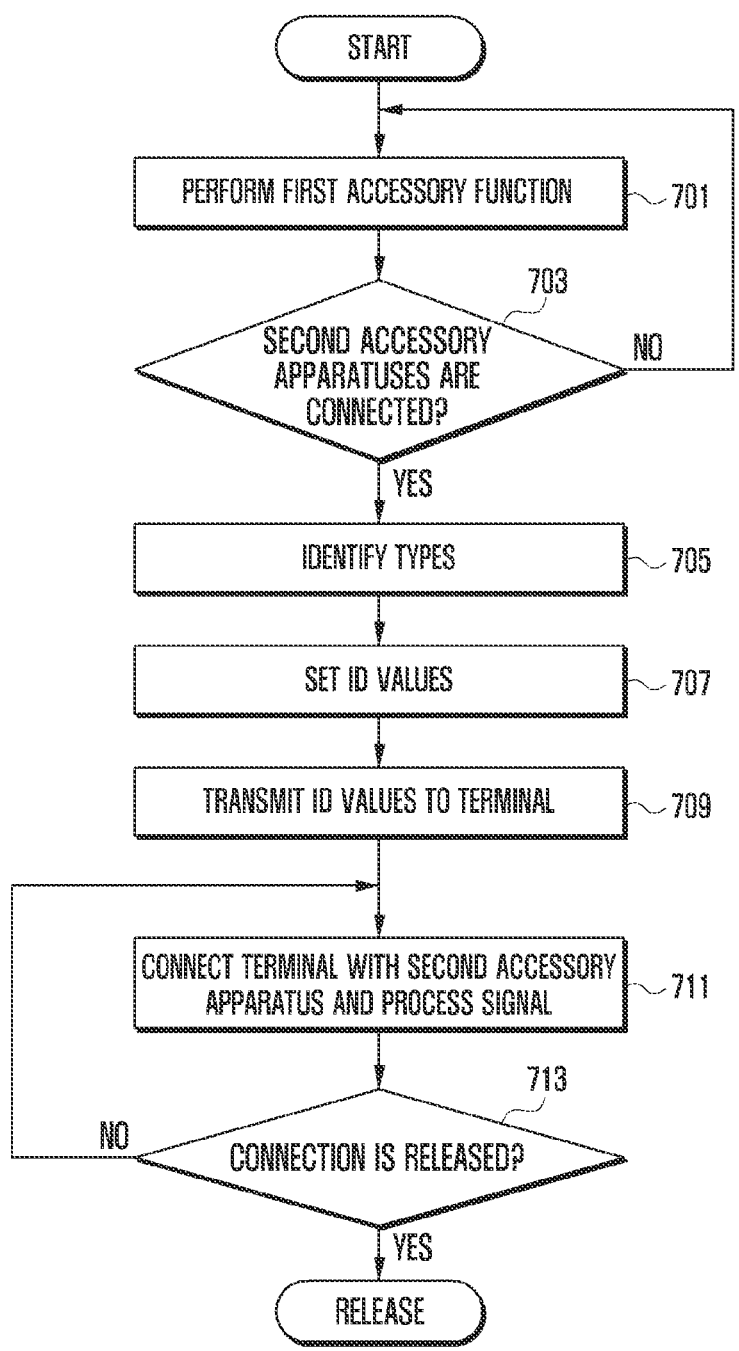
FIG. 7 is a flowchart illustrating a method of operating a first accessory apparatus of an accessory system which supports a hierarchical connection according to an exemplary embodiment of the present invention.

FIG. 7 is a flowchart illustrating a method of operating a first accessory apparatus of an accessory system which supports a hierarchical connection according to an exemplary embodiment of the present invention.

Referring to FIG. 7, according to the method of operating the first accessory apparatus 200, the apparatus controller 260 first supports a first accessory function of the apparatus in step 701 and determines whether the second accessory apparatuses 300 and 400 are connected in step 703. The first accessory apparatus 200 is connected with the terminal 100 and is in a state where the first accessory function of the first accessory apparatus 200, for example, a charging function or a charging and audio output function is provided, in step 701. When there is no connection of the second accessory apparatuses 300 and 400, the first accessory apparatus 200 may support performance of the first accessory function.

Meanwhile, when the second accessory apparatuses 300 and 400 are connected in step 703, then the apparatus controller 260 proceeds to step 705 and identifies types of second accessory apparatuses 300 and 400. When the types of second accessory apparatuses 300 and 400 are identified in step 705, then the apparatus controller 260 sets ID values corresponding to the connected second accessory apparatuses 300 and 400 or a particular accessory apparatus which may support the functions of the first accessory apparatus and the second accessory apparatuses 300 and 400 in step 707. The setting of the ID values may be a process in which the terminal controls the resistance value connected with the USB ID line for determining a type of external accessory apparatus.

When the ID values are set in step 707, then the first accessory apparatus 200 supports transmission of the ID values to the terminal 100 in step 709. For the transmission of the ID values, the terminal 100 may have a state where the terminal 100 is pre-connected with the first accessory apparatus 200. Next, the terminal 100 is connected with the second accessory apparatuses 300 and 400, via the first accessory apparatus 200, to support connections and signal processing of the accessory apparatuses supported by the terminal 100 in step 711.

Thereafter, the first accessory apparatus 200 determines whether the connection with the terminal 100 is released in step 713. When the connection is not released, then the first accessory apparatus 200 returns to step 711 and supports performance of the function. Particularly, when the connections of the second accessory apparatuses 300 and 400 are released while the first accessory apparatus 200 maintains the connection with the terminal 100, then the first accessory apparatus 200 performs signal processing for supporting the first accessory function of the first accessory apparatus 200 in the terminal 100.

In order to support the operating method, the first accessory apparatus 200 may include resistances corresponding to one or more accessory apparatuses and an ID switch for supporting a selective connection between one of the resistances and the terminal connection interface. Alternatively, the first accessory apparatus 200 may include resistances corresponding to particular accessory apparatuses which support one or more functions supported by the one or more accessory apparatuses and the basic function and an ID switch which supports a selective connection between one of the resistances and the terminal connection interface. Meanwhile, the first accessory apparatus 200 may include a variable resistance instead of the resistances and the ID switch. The variable resistance is connected with the terminal connection interface and has one or more resistance values for identifying types of one or more accessory apparatuses according to a control of the apparatus controller. Further, the variable resistance is connected with the terminal connection interface and has one or more resistance values for identifying types of particular accessory apparatuses which support the functions of the one or more accessory apparatuses and the basic function according to a control of the apparatus controller.

Accordingly, when a plurality of accessory apparatuses are connected, then the apparatus controller may set a resistance value corresponding to a predefined particular accessory apparatus which supports functions of the plurality of accessory apparatuses. Further, the apparatus controller may set a resistance value corresponding to another connected accessory apparatus. The apparatus controller may set a resistance value corresponding to a predefined particular accessory apparatus which supports the functions of the one or more connected accessory apparatuses and the basic function provided by default.

Meanwhile, although it has been described that the resistance value is set so as to identify the accessory apparatus of the terminal, the present invention is not limited thereto. That is, the apparatus controller of the first accessory apparatus directly communicates with the terminal connected through the terminal connection interface to provide predefined particular information for identification as the particular accessory apparatus. That is, the apparatus controller may provide a support such that predefined information for identification as the particular accessory apparatus is provided to the terminal by using the USB ID port. According to another exemplary embodiment of the present invention, the resistances, the ID switch, or the variable resistances may be omitted. In such a case, the first accessory apparatus may control transmission of information on a particular accessory apparatus which may provide one or more functions of one or more accessory apparatuses connected with the first accessory function provided by the first accessory apparatus itself to the terminal. When the first accessory apparatus has no first accessory function, then the first accessory apparatus may support transmission of identification information on the connected accessory apparatus or identification information on the particular accessory apparatus corresponding to functions of a plurality of accessory apparatuses to the terminal.

Figure 8:
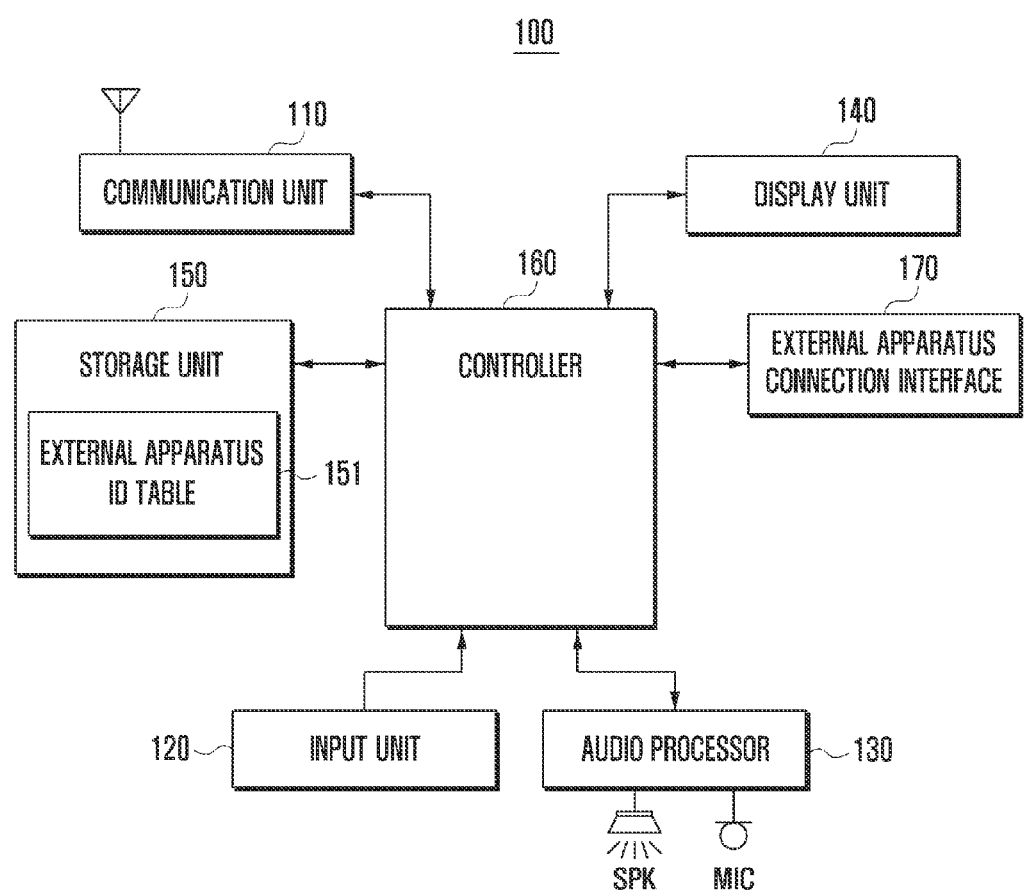
FIG. 8 illustrates a configuration of a terminal of an accessory system which supports a hierarchical connection according to an exemplary embodiment of the present invention.

FIG. 8 is a diagram illustrating the configuration of the terminal of the hierarchical accessory system according to an exemplary embodiment of the present invention.

Referring to FIG. 8, the configuration of the terminal 100 for supporting the hierarchical accessory system according to the present exemplary embodiment includes a communication unit 110, an input unit 120, an audio processor 130, a display unit 140, a storage unit 150, a controller 160, and an external apparatus connection interface 170.

The terminal 100 having the above configuration supports functions of various accessory apparatuses according to a type of accessory apparatus connected with the external apparatus connection interface 170. Particularly, the terminal 100 identifies a resistance value of the accessory apparatus connected with the USB ID line of the external apparatus connection interface 170 and determines a type of connected accessory apparatus by using the corresponding resistance value. The controller 160 of the terminal 100 places pull-up power in the USB ID line of the external apparatus connection interface 170 and identifies a change in the pull-up power by the connected accessory apparatus to identify the resistance value of the accessory apparatus. Further, the controller 160 may identify a type of accessory apparatus by comparing an external apparatus ID table 151 stored in the storage unit 150 with the identified resistance value.

When the accessory apparatus is identified, then the controller 160 of the terminal 100 performs signal processing and a connection state control for supporting a function of the corresponding accessory apparatus. That is, the controller 160 performs signal processing for supporting functions of the connected accessory apparatuses based on the variable resistance 245 set to the first accessory apparatus 200 or set resistance values of the resistances 243, performs a signal output according to the signal processing, and supports a function of a particular accessory apparatus. For example, when the resistance value of the first accessory apparatus 200 is a value corresponding to the audio output desk dock, then the controller 160 performs a charging function by using power supplied through the terminal connection interface 210 of the first accessory apparatus 200, and transmits an audio signal reproduced in the terminal 100 or a received audio signal to the first accessory apparatus 200.

When the first accessory apparatus 200 receives the audio signal from the terminal 100, the first accessory apparatus 200 performs a control of the first switch 271 to transmit the received audio signal to the second accessory apparatuses 300 and 400 connected with the first connection interface 220 or transmits the received signal to the second accessory apparatuses 300 and 400 connected with the second connection interface 230. Further, the first accessory apparatus 200 may transmit power from a charger connected with the first connection interface 220, or a charger connected with the power connection interface 290, to the terminal 100. Accordingly, the second accessory apparatuses 300 and 400 connected with the first accessory apparatus 200 may be a charger and an audio output apparatus. Although it has been described that the charger corresponds to the second accessory apparatuses 300 and 400, the charger may actually correspond to a first accessory function of the first accessory apparatus 200. That is, the first accessory apparatus 200 may be a dock which supports the charging function of the terminal as a basic function, or in other words, the first accessory function, corresponding to a default function, and additionally supports performance of the functions of the second accessory apparatuses 300 and 400 connected through the connection interface.

Meanwhile, when the resistance value of the USB ID line of the external apparatus connection interface 170 is changed, then the controller 160 of the terminal 100 controls signal processing for supporting a function of the accessory apparatus corresponding to the changed resistance value. For example, when the resistance value is changed through identification of the USB ID line in a predetermined period, then the controller 160 determines that the accessory apparatus corresponding to the changed resistance value is newly connected and performs signal processing for supporting the function of the corresponding accessory apparatus.

Alternatively, when the controller 160 receives a reset signal from the first accessory apparatus 200, then the controller 160 determines the resistance value of the first accessory apparatus 200 connected with the external apparatus connection interface 170 according to the received reset signal and supports signal processing for supporting the function corresponding to the accessory apparatus corresponding to the determined resistance value.

When the first accessory apparatus 20 is connected with the external apparatus connection interface 170, then the display unit 140 of the terminal 100 supports a function according to a type of connected first accessory apparatus 200 and also outputs a screen according to the corresponding function support. For example, when the resistance value of the first accessory apparatus 200 is a value corresponding to the audio output desk dock, then the display unit 140 displays a predefined image or text information corresponding to the connection of the audio output desk dock. Further, the display unit 140 supports a pre-scheduled information output for supporting a function of the audio output desk dock, for example, a time information output and an output of information related to the audio signal output to the first accessory apparatus 200.

When the resistance value of the first accessory apparatus 200 is a value corresponding to a data synchronization desk dock, then the display unit 140 may output image or text information corresponding to data synchronization. Further, the display unit 140 may output particular information corresponding to data transmission/reception generated during an actual data synchronization process. The particular information output to the display unit 140 includes information corresponding to the first accessory apparatus 200 and further includes information on a type of particular accessory apparatus corresponding to a resistance value set by the first accessory apparatus 200 according to the connections of the second accessory apparatuses 300 and 400 and information used for supporting the particular accessory apparatus.

The communication unit 110 corresponds provides a communication function of the terminal 100, and may be omitted when the communication function is not supported. When the communication unit 110 is added, information received by the communication unit 110 may be transmitted to at least one of the first accessory apparatus 200 and the second accessory apparatuses 300 and 400 through the external apparatus connection interface 170 according to a control of the controller 160. Further, the communication unit 110 may perform an update of the external apparatus ID table 151 stored in the storage unit 150. The external apparatus ID table 151 is a table which includes information on resistance values of various accessory apparatuses. The table may be updated by setting new regulations and updating and/or adding information on the resistance valued of the various accessory apparatuses. When the update of the table is generated and a particular server provides the update, the communication unit 110 receives the update and transmits it to the storage unit 150 according to a control of the controller 160.

The audio processor 130 includes a speaker SPK and a microphone MIC and may be activated or inactivated according to a type of accessory apparatus connected with the external apparatus connection interface 170. That is, when the accessory apparatus includes an audio output function, the audio processor 130 may be inactivated. Alternatively, even though an accessory apparatus having the audio output function is connected with the external apparatus connection interface 170, the audio processor 130 may be activated to support the audio signal output. During such a process, the controller 160 controls an audio signal according to reproduction of a particular application program to be transmitted to the accessory apparatus through the external apparatus connection interface 170 and controls an audio signal according to reproduction of another application program to be output through the speaker SPK of the audio processor 130 mounted to the terminal 100. The input unit 120 may generate an input signal for setting the function according to a user's setting and transmits the generated input signal to the controller 160. Accordingly, the user may control the input unit 120 to control the activation or inactivation of the audio processor 130 or change the setting. As a result, the terminal 100 provides a support such that a particular audio signal is output through the audio processor 130 or blocked in an environment where the accessory apparatus is connected with the external apparatus connection interface 170 and also provides a support such that the same audio signal as the audio signal output to the accessory apparatus is output through the audio processor 130.

The storage unit 150 stores the external apparatus ID table 151 and various application programs and contents needed for driving the terminal 100. Particular contents stored in the storage unit 150, for example, audio contents or video contents, are activated according to a user's request and a control of the controller 160 and then output through the audio processor 130 and the display unit 140, or output to the accessory apparatuses connected with the external apparatus connection interface 170.

Meanwhile, the terminal 100 may further include various additional modules according to a provision type. That is, the terminal 100 may further include components which have not been mentioned, such as an interface for data transmission/reception by a wired communication scheme or wireless communication scheme, an Internet communication module for performing an Internet function through communication with an Internet network, a digital broadcasting module for performing a function of receiving and reproducing digital broadcasting, and any other similar and/or suitable modules that may be included in the terminal 100. All the components may not be listed due to their various transformations according to a trend of convergence of digital devices, but components in the same level as that of the aforementioned components may be further included in the device. Further, it is apparent that particular components of the terminal 100 according to the present invention are omitted or replaced with other components in the above configuration. It will be easily understood by those skilled in the art.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An electronic device comprising:
    a terminal connection interface connecting to a terminal;
    a plurality of resistances electrically connected to an identifier switch;
    an identifier switch selectively connecting one of the plurality of resistances with the terminal connection interface;
    at least one connection interface connecting to the at least one external device; and
    at least one processor configured to:
        identify a resistance value corresponding to the at least one external device connected to the at least one connection interface,
        select a resistance among the plurality of resistances, the selected resistance being matched to the identified resistance value, and
        control the identifier switch to connect the selected resistance with the terminal connection interface such that the terminal determines that the at least one external device is connected to the at least one connection interface.

2. The electronic device of claim 1, wherein, when a plurality of external devices are connected, the at least one processor is further configured to set a resistance value corresponding to a predefined external devices which supports functions of the plurality of external devices.

3. The electronic device of claim 1, wherein the at least one processor is further configured to set a resistance value corresponding to a predefined external device which supports functions of the at least one external device that is connected and a basic function provided by the at least one connected other external device.

4. The electronic device of claim 1, wherein the identifier (ID) switch is further configured to selectively connect resistances corresponding to a particular external device which supports functions of the at least one external device and a basic function with the terminal connection interface.

5. The electronic device of claim 1, further comprising a variable resistance setting at least one resistance value identifying a type of particular external device supporting functions of the at least one external device and a basic function according to a control of the at least one processor, the variable resistance being connected with the terminal connection interface.

6. The electronic device of claim 1, wherein the at least one connection interface comprises at least one of a power connection interface for a power connection, a first connection interface for a Micro-Universal Serial Bus (USB) connection, or a second connection interface for a jack connection.

7. The electronic device of claim 6, further comprising a first switch controlling a selective connection between the terminal connection interface and one of the first connection interface and the second connection interface according to a control of the at least one processor.

8. The electronic device of claim 1, wherein, when at least one of the at least one other external device is separated from the terminal, the at least one processor is further configured to control a resistance value corresponding to a particular external device for supporting functions except for functions of the separated at least one other external device to be provided to the terminal.

9. A system supporting a hierarchical connection, the system comprising:
   a terminal having an external connection interface in a Micro-Universal Serial Bus (USB) type;
   an electronic device connected to the external connection interface of the terminal; and
   at least one external device connected to the electronic device,
   wherein the electronic device comprises:
      a terminal connection interface connecting to the terminal;
      a plurality of resistances electrically connected to an identifier switch;
      an identifier switch selectively connecting one of the plurality of resistances with the terminal connection interface;
      at least one connection interface connecting to the at least one external device; and
      at least one processor configured to:
         identify a resistance value corresponding to the at least one external device connected to the at least one connection interface,
         select a resistance among the plurality of resistances, the selected resistance being matched to the identified resistance value, and
         control the identifier switch to connect the selected resistance with the terminal connection interface such that the terminal determines that the at least one external device is connected to the at least one connection interface.

10. The system of claim 9,
    wherein the at least one processor is further configured to set a resistance value corresponding to one of the at least one external device when the one of the at least one external device is connected to the electronic device, and
    wherein the at least one processor is further configured to set a resistance value corresponding to a predefined external device which supports functions of the at least one external device when the at least one external device is connected to the electronic device.

11. The system of claim 9, wherein the at least one processor is further configured to set a resistance value corresponding to a predefined external device which supports the functions of the at least one external device that is connected and a basic function provided by the electronic device.

12. The system of claim 9, wherein the identifier (ID) switch is further configured to selectively connect resistances corresponding to the at least one external device or resistances corresponding to a particular external device which supports the functions of the at least one external device and a basic function and one of the resistances with the terminal connection interface.

13. The system of claim 9, further comprising a variable resistance for setting at least one resistance value identifying types of the at least one external device according to a control of the at least one processor, the variable resistance being connected with the terminal connection interface.

14. The system of claim 9, further comprising a variable resistance setting at least one resistance value for identifying a type of a particular external device which supports the functions of the at least one external device and the basic function according to a control of the at least one processor.

15. The system of claim 9, wherein the at least one connection interface comprises:
    at least one of a power connection interface for a connection of the external device supplying power, a first connection interface for a connection of the external device in a Micro-USB type, or a second connection interface for a connection of the external device in a jack connection type; and
    a first switch controlling a selective connection between the terminal connection interface and one of the first connection interface and the second connection interface according to a control of the at least one processor.

16. The system of claim 9, wherein, when at least one of the at least one external device is separated, the at least one processor is further configured to control a resistance value corresponding to a particular external device for supporting functions except for functions of the at least one external device to be provided to the terminal.

17. A method of operating an electronic device supporting a hierarchical connection to a terminal, the method comprising:
    connecting a terminal connection interface of an electronic device with a terminal;
    connecting at least one other external device with at least one connection interface of the electronic device;
    identifying a resistance value corresponding to the at least one other external device connected to the at least one connection interface;
    selecting a resistance among a plurality of resistances, the selected resistance being matched to the identified resistance value; and
    controlling an identifier switch to connect the selected resistance with the terminal connection interface such that the terminal determines that the at least one external device is connected to the at least one connection interface.

18. The method of claim 17, wherein the controlling of the variable resistance comprises setting a resistance value corresponding to the at least one external device connected to the electronic device.

19. The method of claim 17, wherein the controlling of the variable resistance comprises:
    connecting a plurality of external devices; and
    setting a resistance value corresponding to a predefined external device which supports functions of the plurality of external devices.

20. The method of claim 17, wherein the controlling of the variable resistance comprises setting a resistance value corresponding to a predefined external device which supports functions of the at least one external device connected to the electronic device and a basic function provided by the electronic device.

21. The method of claim 17, further comprising:
    separating, from the terminal, the at least one external device connected to the terminal; and controlling the terminal to identify a resistance value corresponding to a particular external device for supporting functions except for functions of the at least one external device separated from the terminal.

* * * * *